United States Patent
Kohmura et al.

(10) Patent No.: US 7,924,561 B2
(45) Date of Patent: Apr. 12, 2011

(54) CIRCUIT BOARD CASE

(75) Inventors: Yoshihiko Kohmura, Nagoya (JP); Masaru Kondo, Kasugai (JP); Shingo Yoshida, Ichinomiya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 20 days.

(21) Appl. No.: 12/509,857

(22) Filed: Jul. 27, 2009

(65) Prior Publication Data

US 2010/0018892 A1    Jan. 28, 2010

(30) Foreign Application Priority Data

Jul. 28, 2008    (JP) .................................. 2008-193645
Mar. 31, 2009    (JP) .................................. 2009-084469

(51) Int. Cl.
*H05K 7/20* (2006.01)
*G01N 7/00* (2006.01)
*H05K 5/03* (2006.01)

(52) U.S. Cl. ................... 361/690; 361/692; 361/679.01; 361/752; 174/50; 174/50.51; 174/50.52; 174/520; 73/23.31; 73/31.05; 73/25.05; 422/83; 422/94

(58) Field of Classification Search ............. 361/679.01, 361/600, 690, 692, 752, 807, 809; 174/50, 174/50.51, 50.52, 520, 544; 312/223.2, 223.3, 312/236; 24/292, 297, 458, 459, 555, 587.1, 24/662, 659; 422/83, 94, 98, 114, 103, 104, 422/96, 97; 73/23.31, 23.32, 23.33, 25.05, 73/31.01, 31.02, 31.05; 204/406, 431, 432
See application file for complete search history.

(56) References Cited

U.S. PATENT DOCUMENTS

| | | | | |
|---|---|---|---|---|
| 3,819,330 A | * | 6/1974 | Creighton | 422/83 |
| 4,742,763 A | * | 5/1988 | Holter et al. | 454/75 |
| 5,624,639 A | * | 4/1997 | Ariga et al. | 422/83 |
| 5,750,880 A | * | 5/1998 | Frers | 73/31.02 |
| 6,548,023 B1 | * | 4/2003 | Matsuo et al. | 422/83 |
| 6,757,155 B2 | * | 6/2004 | Koike et al. | 361/600 |
| 7,189,363 B2 | * | 3/2007 | Osawa et al. | 422/83 |
| 2008/0190174 A1 | * | 8/2008 | Kooi et al. | 73/31.01 |

FOREIGN PATENT DOCUMENTS

| | | | |
|---|---|---|---|
| JP | 62-153156 U | | 9/1987 |
| JP | 2003344337 A | | 12/2003 |
| JP | 2006-341668 A | | 12/2006 |
| JP | 2006332574 A | * | 12/2006 |
| JP | 02007131255 A | * | 5/2007 |

OTHER PUBLICATIONS

Japanese Office Action issued on Nov. 29, 2010 in the corresponding Japanese Patent Application No. 2009-084469.

* cited by examiner

*Primary Examiner* — Michael V Datskovskiy
(74) *Attorney, Agent, or Firm* — Sughrue Mion, PLLC

(57) ABSTRACT

A circuit board case including: a cover that includes a cover front wall and a rise wall connected to the cover front wall, the cover being attachable to an attaching object at a position on the rise wall opposite the cover front wall; and a case that houses a circuit board and includes a case front wall and a first wall surface oriented toward a direction opposite the case front wall, the case being housed in the cover such that the case front wall opposes the cover front wall. A fitting that engages the first wall surface is formed in the rise wall of the cover so as to urge the case toward the cover front wall and thus hold the case within the cover.

9 Claims, 6 Drawing Sheets

CIRCUIT BOARD CASE

BACKGROUND OF THE INVENTION

1. Field of the Invention

The present invention relates to a circuit board case adapted for mounting to a vehicle, which includes a case for housing a circuit board and a cover for covering the case.

2. Description of the Related Art

In order to detect a specific gas component in the exhaust gas of an internal combustion engine e.g., of an automobile, a gas sensor is widely used. The gas sensor is connected to a circuit board which receives a sensor output signal and controls the gas sensor. Such a circuit board is housed in a case for the purposes of waterproofing, dustproofing, and the like. Further, in order to protect the case from flying gravel, and the like, flung upwards during driving, a circuit board case is configured by covering the case with a cover. The circuit board case covered with the cover is mounted under a floor of the vehicle (see, for example, JP-A-2006-341668).

As shown in FIG. 10, in a general circuit board case, a case 100 is held in a cover 500 by allowing latch claws 110 provided on side surfaces of the case 100 to engage respective engagement holes 510 formed on the side surfaces of the cover 500. The cover 500 is then secured to a frame, or the like, of a vehicle with bolts.

In the case of the above-described circuit board case, the cover 500 is secured to the vehicle with bolts. However, the case 100 is merely held at the side surfaces thereof to the cover 500 by way of the latch claws 110. Therefore, when a large physical impact is inflicted on a front wall of the cover 500 (a surface of the cover 500 opposite the surface of the cover 500 fixed to the vehicle), portions of the cover 500 which face the side surfaces of the case 100 open outward, which may cause the case 100 to fall out of the cover 500.

SUMMARY OF THE INVENTION

The present invention was made in consideration of the above circumstances, and an object thereof is to provide a circuit board case in which a case provided in a cover is not easily dislodged even when physical shock is inflicted on a front wall of the cover, to thereby reliably hold the case therein.

The above objects have been achieved by providing, in a first aspect (1) of the invention, a circuit board case which comprises: a cover that comprises a cover front wall and a rise wall connected to the cover front wall, the cover being attachable to an attaching object at a position on the rise wall opposite the cover front wall; a case that houses a circuit board and comprises a case front wall and a first wall surface oriented toward a direction opposite the case front wall, the case being housed in the cover such that the case front wall opposes the cover front wall, wherein a fitting that engages the first wall surface is formed in the rise wall of the cover so as to urge the case toward the cover front wall, to thereby hold the case within the cover.

In this aspect, the fitting of the cover engages the first wall surface of the cover, and the case is held in the cover while being urged toward the cover front wall. Therefore, even when physical impact, and the like, is inflicted on the front wall side of the cover, the urging force counteracts the physical impact. Further, even when the side surfaces of the cover are opened by physical impact, the fitting engages the first wall surface of the case. Hence, the case is not easily dislodged from the cover and can reliably be held therein.

The fitting may be joined to the cover. However, forming the fittings integrally with the cover is preferable in terms of reducing the number of components and cost.

In a preferred embodiment (2) according to (1) above, the fitting elastically urges the first wall surface of the case toward the cover front wall of the cover.

In another preferred embodiment (3) according to (1) or (2) above, the fitting is elastically deformable when the case is housed in the cover from an opening opened in a position on the cover opposite the cover front wall, and the fitting elastically holds the case in the cover.

In this configuration, the fitting returns to its original position by means of elastic force, to thus elastically hold the case when the case is housed in the cover from the opening thereof and climbs over the fitting. Therefore, holding and urging the case are performed by means of only inserting the case into the cover from its opening, and it is not necessary to carry out additional work such as folding of the fitting, so that working efficiency is enhanced. Further, even when vibration or physical impact is inflicted on the cover, the vibration or the impact is absorbed by elastic force of the fitting. This is because the case is elastically held by the fitting, so that vibration, and the like, can hardly reach the case.

In yet another preferred embodiment (4) according to (3) above, the fitting has a free end facing the cover front wall, and a fixed end opposite the cover front wall and fixed to the rise wall. The fitting comprises a projection projecting toward an inside of the cover, and the case is inserted in the cover from the opening by climbing over the projections so as to be urged toward the cover front wall.

In this configuration, even when physical impact, and the like, is inflicted on the cover front wall after the case is housed in the cover from its opening so as to climb over the projection of the fitting, the fitting resists opening in the direction of the physical impact (i.e., the direction from the cover front wall to a rear surface) so as to further prevent the case from falling out of the cover. In contrast, when the fixed end of the fitting is situated at a position close to the cover front wall, a portion of the fitting closer to its distal end than to the fixed ends is likely to open when physical impact, and the like, is inflicted on the cover front wall.

In yet another preferred embodiment (5) according to (4) above, the fitting has an L-shaped cross-sectional profile that has the projection as an apex and recedes toward the free end and the fixed end, and the first wall surface of the case engages a surface of the fitting extending from the projection to the free end.

In this configuration, the first wall surface of the case is supported by an L-shaped portion (surface) of the fitting extending from the projection to the distal end (free end). Therefore, the case is reliably held in the cover.

In yet another preferred embodiment (6) according to (1) above, the fitting extends toward an inside of the cover from a fixed end thereof to a free end thereof, and the first wall surface of the case engages the free end of the fitting and is urged toward the cover front wall.

In this configuration, the first wall surface of the case is supported by the free end. Therefore, the case is reliably held in the cover.

In yet another preferred embodiment (7) according to any of (4) to (6) above, the case comprises regulation members provided at front and back positions on the case along a longitudinal direction perpendicular to a direction in which the fitting extends, outer surfaces of the respective regulation members are situated at an outer side of the case with reference to the projection of the fitting, an interval between the regulation members is equal to or larger than a length of the fitting in the longitudinal direction; and movement of the case in the longitudinal direction is regulated by placing the fitting between the regulation members.

In this configuration, the fitting is arranged so as to enter between the regulation members, whereby movement of the case in the longitudinal direction is regulated.

In yet another preferred embodiment (8) according to any of (1) to (7) above, a space is formed between the cover front wall and the case, and an elastic member is interposed in the space.

In this configuration, even when vibration or physical impact is inflicted on the cover, the elastic member absorbs the vibration or physical impact, so that vibration, and the like, can hardly reach the case. Further, the case is held in a sandwiched manner within the cover by virtue of an urging force of the fitting and an elastic force of the elastic member, and hence the case can be held in the cover more stably.

In yet another preferred embodiment (9) according to any of (1) to (8) above, the case front wall comprises a vent portion covered with the cover front wall and comprising a filter having air permeability and water repellency so as to allow air in and out of the case.

In this configuration, since the vent portion is covered with the cover front wall and protected from flying gravel, and the like, the occurrence of a fracture in the vent portion including the filter is prevented by the cover front wall. Further, clogging of the vent portion, which would otherwise result due to deposition of dust, and the like, in the vent portion, is also prevented by the cover front wall.

According to the above aspects of invention, even when physical impact is inflicted on a front wall of a cover, a case provided in the cover is not easily dislodged from the cover and can reliably be held therein.

DETAILED DESCRIPTION OF THE PREFERRED EMBODIMENTS

Embodiments of the present invention will next be described with reference to the drawings. However, the present invention should not be construed as being limited thereto.

Figure 1:
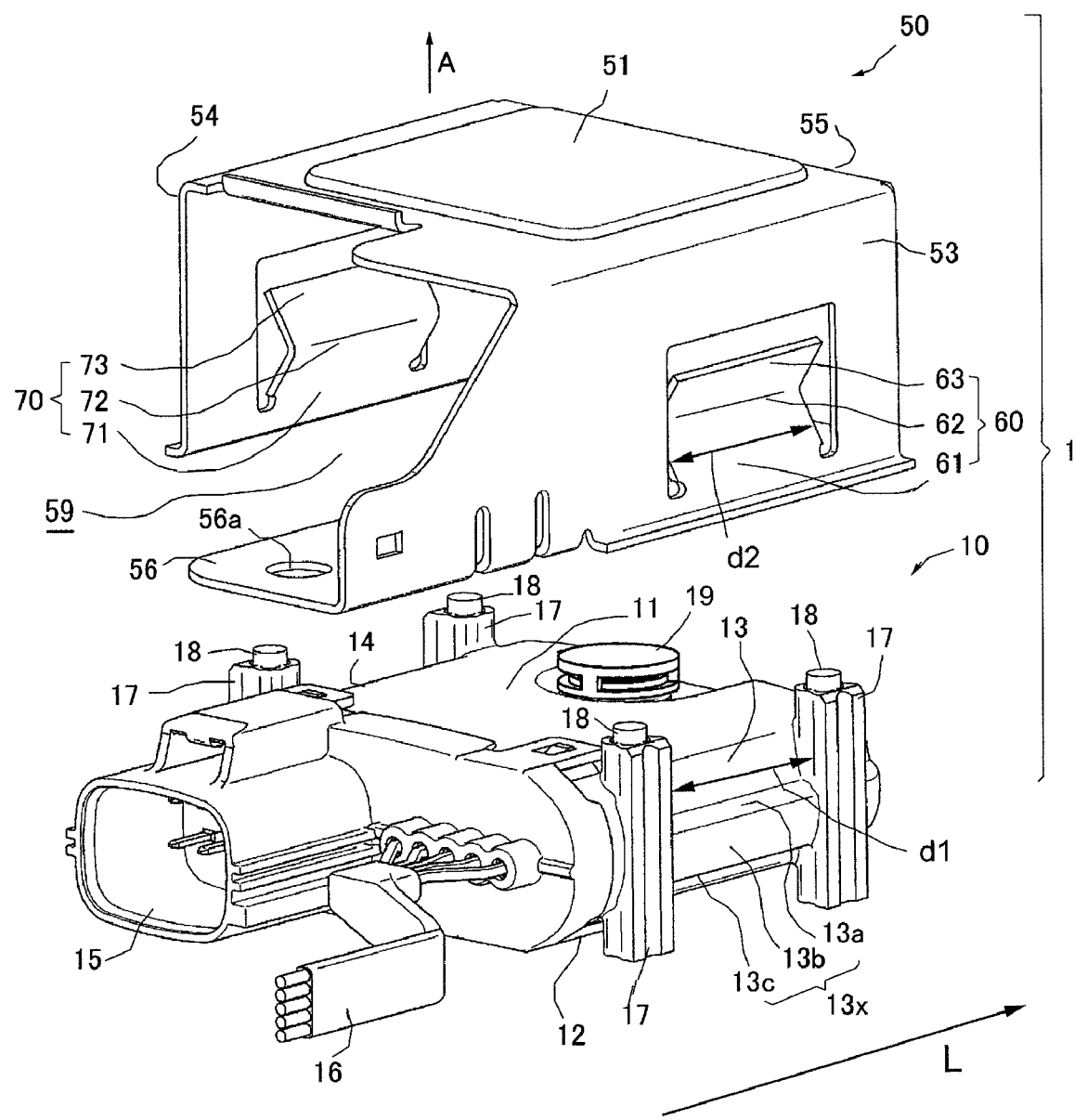
FIG. 1 is an exploded perspective view showing a case and a cover that form a circuit board case of a first embodiment of the present invention.

FIG. 1 is an exploded perspective view showing a circuit board case 1 including a case 10 and a cover 50, according to a first embodiment of the present invention.

The case 10 is made of a resin and forms a tube having an elliptical cross section, and a circuit board is housed in the case 10. The cross section of the case 10 is elliptical. A planar portion of the case 10 corresponding to a straight portion of an upper half of the ellipse in cross section defines a case front wall 11. Likewise, another planar portion of the case 10 corresponding to the straight portion of a lower half the ellipse in cross section defines a case rear wall 12. The case rear wall 12 opposes the case front wall 11. Curved portions of the case 10 each having a circular arc of the ellipse in cross section define case side walls 13 and 14, respectively. A gas sensor male connector 15 having an elliptical tube shape in cross section and extending outwardly is provided on a left side of one end face of the case 10 parallel to the elliptical cross-sectional profile of the case 10 with reference to a center thereof Likewise, a harness 16 to be connected to an ECU connector (not shown) is provided on a right side of the one end face. Single ends of terminal metal fitting connected to a circuit board protrude to the inside of the tube of the gas sensor male connector 15. Moreover, a vent portion 19 (described below) for use in letting air in and out the case 10 is provided on the case front wall 11.

In the embodiments, a direction perpendicular to a direction in which a fitting 60 of a cover 50 extends from its free end 63 to its fixed end 61 is defined as a longitudinal direction L. In other words, in the first embodiment, the longitudinal direction L is perpendicular to the elliptical of the case 10 in cross section.

The gas sensor male connector 15 is connected to a gas sensor (not shown). The ECU connector is connected to an ECU (an engine control unit). A circuit board including a sensor control circuit converts a sensing signal from the gas sensor to a concentration signal and sends the concentration signal to the ECU. As the gas sensor, an oxygen sensor for sensing the concentration of oxygen in an exhaust gas, a wide-range A/F sensor, an NOx sensor for sensing the concentration of NOx in an exhaust gas, or the like, can be used.

The circuit board includes a power supply circuit and a control circuit formed thereon, and various electronic components are implemented on the circuit board. The circuit board is housed in the case 10 such that opposing surfaces of the circuit board are parallel to the case front wall 11 and the case rear wall 12.

A center portion of a case side wall 13 forms a rib portion 13x that extends in parallel with the case front wall 11 and that outwardly protrudes. The rib portion 13x includes a first rise portion 13a that rises from the case front wall 11 side, a flat portion 13b that extends from the first rise portion 13a so as to be substantially perpendicular to the case front wall 11, and a second rise portion 13c that falls from the flat portion 13b toward the case rear wall 12 side. Further, although not shown, another rib portion 14x similar to the rib portion 13x is formed on a case side wall 14 opposing the case side wall 13. The rib portions 13x and 14x as a whole extend in the longitudinal direction L.

In the case 10, the case rear wall 12 and the second rise portion 13c (a corresponding second rise portion 14c of the side wall 14, as well) each may be referred to as a first wall surface facing a direction opposite the case front wall 11. Meanwhile, in the case 10, the case front wall 11 and the first rise portion 13a (a first rise portion 14a of the side wall 14, as well) each may be referred to as a second wall surface facing the case front wall 11.

Columnar regulation members 17 (a total number thereof is four in this embodiment), which extend in a direction substantially perpendicular to the case front wall 11 and which extend outwardly of the case front wall 11 and the case rear wall 12, are provided at both ends of the rib portion 13x of the case side wall 13 (and both ends of the corresponding rib portion 14x of the side wall 14, as well) in the longitudinal direction L with the rib portion 13x interposed therebetween. A columnar shock-absorbing rubber member (an elastic member) 18 is partially embedded in each of the ends of the regulation members 17 on a same side thereof which is closer to the case front wall 11. Remaining individual ones of the shock-absorbing rubber members 18 protrude from each of the ends of the regulation members 17.

Meanwhile, the cover 50 is positioned above the case front wall 11 of the case 10 and covers the case front wall 11 and the case side walls 13 and 14. The cover 50 protects the case 10 from external physical shocks, such as flying gravel, and holds the case 10 therein. The cover 50 itself is adapted to be mounted on (attached to) a frame, and the like, of a floor of a vehicle that is an object of mounting (attaching object). The vehicle is not particularly limited, but an automobile, a motorcycle, and the like, equipped with an internal combustion system, such as an engine, may be exemplified.

The cover 50 has a substantial rectangular parallelepiped shape. The cover 50 includes a rectangular cover front wall 51 and cover sidewalls 53, 54 and 55 connected to the cover front wall 51 in three directions (the respective cover side walls are generally called "rise walls"). A portion adjacent to the cover front wall 51 that is not provided with a cover side wall and a portion of a rear surface opposing the cover front wall 51 are open. An opening 59 open at a position opposite to the cover front wall 51 is slightly greater than an outer shape (a planar shape) of the case 10 when viewed from a direction perpendicular to the case front wall 11, so that the case 10 can be mounted (inserted) in the cover 50 through the opening 59. Once mounted, the case front wall 11 opposes an inner side of the cover front wall 51.

A left side of the cover side wall 53 (a near or rather viewer side in FIG. 1) outwardly extends from a circumference of the cover front wall 51 so as to define an extended portion, and further extends downwardly from a lower edge of the extended portion so as to define an extra extended area. The extra extended area is further bent inward so as to be in parallel with the cover front wall 51, to thereby define a bracket 56. A mount hole 56a for inserting a bolt is bored in the vicinity of the center of the bracket 56. The cover 50 is mounted to a frame, or the like, of a vehicle while the case 10 is housed in the cover 50. Similarly, a bracket 57 analogous to the bracket 56 (see FIG. 3) is provided on the right side of the cover side wall 54, as well.

The rise walls may include the brackets 56 and 57 to be mounted to a frame, or the like, of a vehicle. The brackets 56 and 57 are situated opposite the cover front wall 51 of the rise walls. Therefore, a rising wall of the cover 50 opposite the cover front wall 51 among the rise walls is mounted to a vehicle.

Further, an arrow A of FIG. 1 designates a side of the cover 50 where the cover front wall 51 is present. A frame, or the like, of the vehicle (not shown) is situated on a side opposite the direction of the arrow A.

A cut having a substantially C-shape is formed in the vicinity of a center portion of the cover side wall 53, which forms the cantilever fitting 60 having the lower end 61 with no cut (i.e., a rear-surface side of the cover 50) provided as a fixed end and an upper end 63 (the side of the cover where the cover front wall 51 is present) with the cut provided as a free end. The fitting 60 is bent into the shape of the letter L at an intermediate position between the lower end 61 and the upper end 63, thereby forming a projection 62 that projects to the inside of the cover 50 (see FIG. 5).

The "L-shaped" cross-sectional profile has the projection 62 as an apex and recedes toward the free end 63 and the fixed end 61. In short, a bent portion of the L-shape corresponds to the projection 62, and ends of the L-shape correspond to the free end 63 and the fixed end 61. Similarly, the cover side wall 54 is also provided with a fitting 70 similar to the fitting 60. A distance between the projection 62 of the fitting 60 and a projection 72 of the fitting 70 is smaller than the outer shape (the planar shape) of the case 10. As described below, when the case 10 is deeply inserted into the cover 50, the case 10 is held between the projection 62 and the projection 72.

Moreover, in the present embodiment, an interval d1 between the two regulation members 17 sandwiching a first wall surface 13c to be engaged with the fitting 60 and an interval d1 between the two regulation members 17 sandwiching another first wall surface 14c to be engaged with the fitting 70 are slightly larger than a length d2 of a respective one of the fittings 60 and 70 in the longitudinal direction L. When the case 10 is housed in the cover 50, outer surfaces of the regulation members 17 are situated closer to the outside of the case 50 than the projections 62 and 72 of the fittings 60 and 70 (that is, when viewed in a direction perpendicular to the longitudinal direction L (viewed from a direction of the arrow A), a distance between the regulation members 17 is greater than a distance between the projections 62 and 72).

Accordingly, the fittings 60 and 70 are arranged so as to enter respective spaces between the two regulation members 17, thereby regulating movement of the case 10 along the longitudinal direction L. The essential requirement is that the outer surfaces of the regulation members 17 are situated closer to the outside of the case 50 than to the projections 62 and 72 of the fittings 60 and 70. The outer surfaces of the regulation members 17 being situated at the outer side of the case 50 with respect to the first wall surfaces 13c and 14c are not indispensable. Moreover, in the present embodiment, the cover 50 is formed integrally from a metal plate, and the fittings 60 and 70 are elastically deformable.

Figure 2:
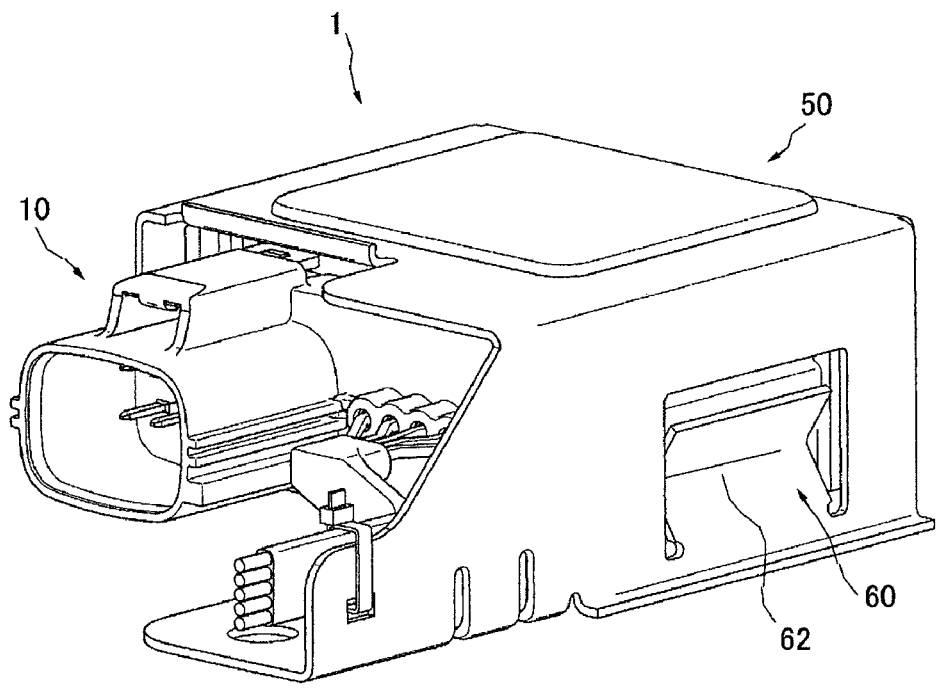
FIG. 2 is a perspective view showing the circuit board case including the case inserted into the cover.

The case 10 is inserted into the cover 50 through the opening 59 and deeply inserted until the rib portions 13x and 14x of the respective case side walls 13 and 14 of the case 10 climb over the respective projections 62 and 72. As a result, the case 10 is urged toward the cover front wall 51. The case 10 is held (elastically held) in the cover 50 while a distal end of the shock-absorbing rubber member 18 of the case 10 contacts the inner side of the cover front wall 51, whereby the circuit board case 1 is configured as shown in FIG. 2. The rear surface of the circuit board case 1 is mounted to a frame, or the like, of a vehicle with the two brackets 56 and 57, whereby the circuit board case 1 can be securely attached to the vehicle while protecting the case 10.

Figure 3:
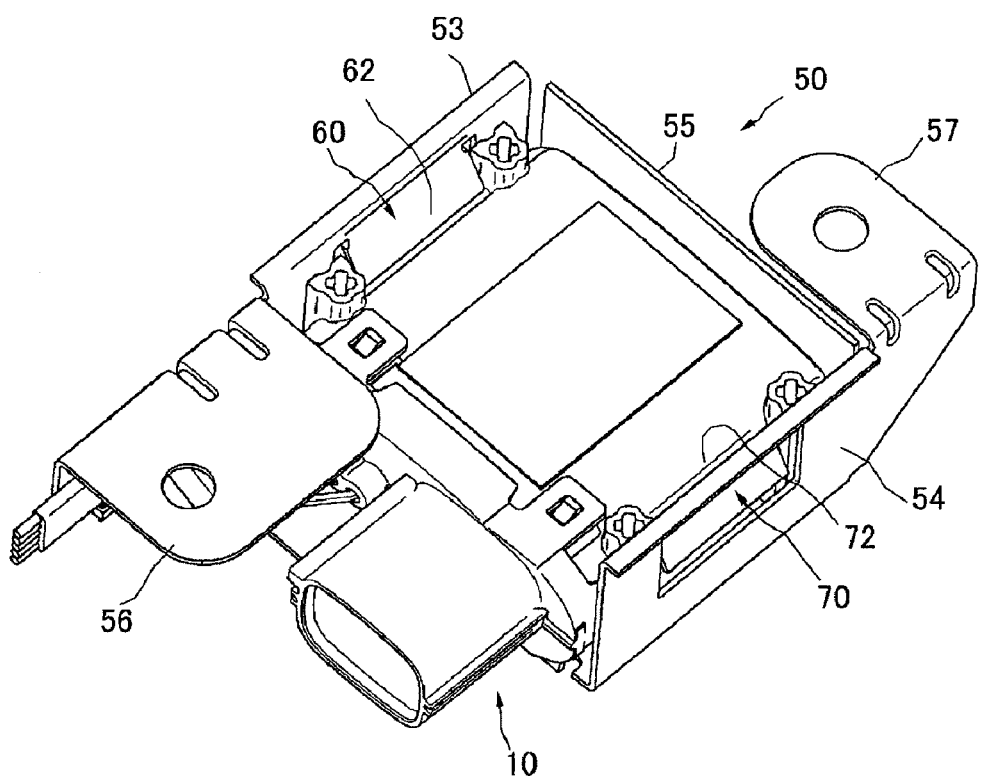
FIG. 3 is a view showing the circuit board case of the first embodiment when viewed from a rear surface side of the cover.

FIG. 3 shows the circuit board case 1 when viewed from the rear surface side of the cover 50. The case 10 climbs over the respective projections 62 and 72, and the fittings 60 and 70 engage a first wall surface (described below) of the case 10, thereby holding (elastically holding) the case 10 so as to urge the case 10 toward the cover front wall 51.

Figure 4:
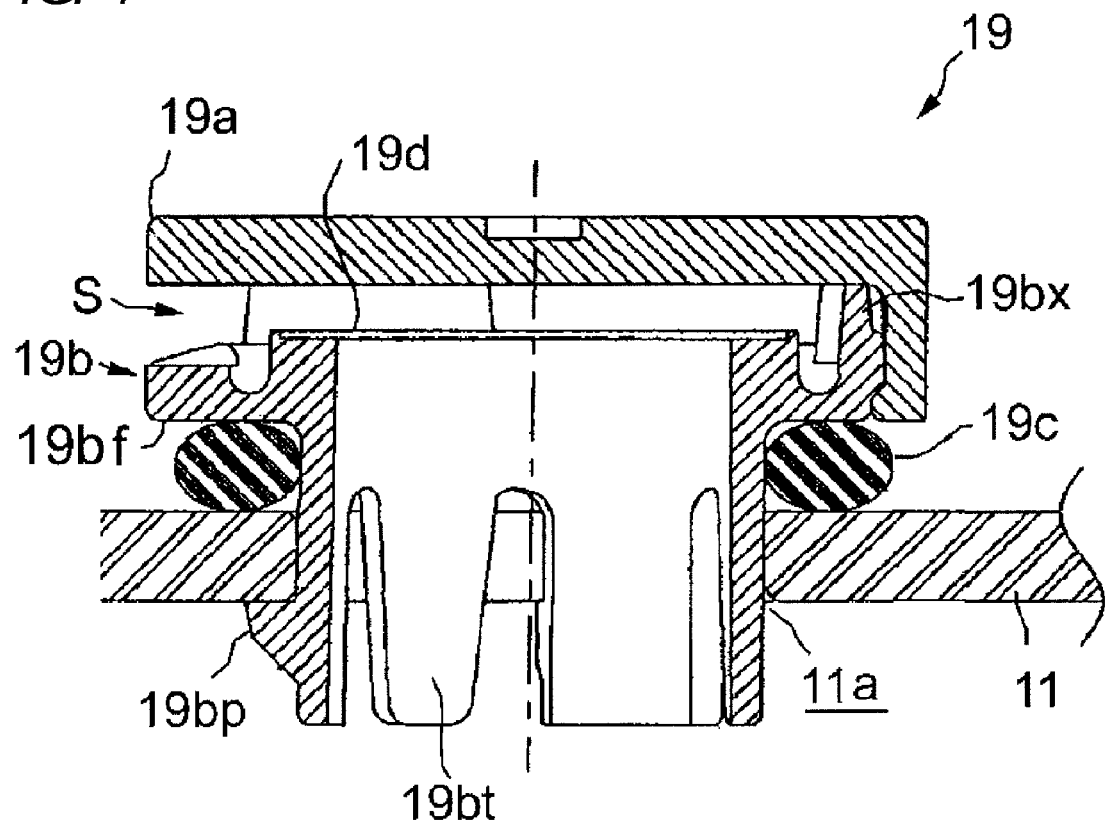
FIG. 4 is a cross-sectional view of a vent portion taken along a plane extending along an axial direction of the vent portion.

FIG. 4 is a cross-sectional view of the vent portion 19 cut along a plane extending along an axial direction of the vent portion 19. The vent portion 19 allows air in and out the case 10, thereby preventing inflation of and a fracture in the case 19, which would otherwise result if the internal pressure of the case 10 were to become lower than the external pressure.

The vent portion 19 includes: a substantially-cylindrical housing 19b made of a resin; a cover 19a attached to an upper surface of the housing 19b; a sealing member (an O-ring) 19c; and a water repellent filter 19d exhibiting both air permeability and water repellency. The water repellent filter 19d is welded to an upper surface of the housing 19b, and a flange 19bf outwardly projecting along a radial direction is formed on an upper portion of the housing 19b. Slits are axially formed in a lower side wall of the housing 19b, and pieces 19bt separated from one another by the slits are radially deformable. Engagement claws 19bp outwardly projecting in the radial direction are formed at respective ends of the pieces 19bt.

The O-ring 19c is attached to a position below the flange 19bf of the housing 19b. In this state, when the housing 19b is inserted into a case hole 11a opened in the case front wall 11, the pieces 19bt are temporarily deformed inwards. Thereafter, when the housing 19b is further inserted, the pieces 19bt return to their original shapes by virtue of their elastic force. Accordingly, the engagement claws 19bp engage the inner surface of the case front wall 11. At this time, O-ring 19c is collapsed between the flange 19bf and the outer surface of the case front wall 11. Consequently, the O-ring 19 hermetically seals the vent portion 19 (the housing 19b) and the case front wall 11. Accordingly, the vent portion 19 is fixed to the case front wall 11.

Meanwhile, three arms 19bx are formed so as to upwardly rise from three points (only one of them is illustrated in FIG. 4) on the flange 19bf of the housing 19b, and the cover 19a is attached to tip ends of the arms 19bx. A slit S is formed between an upper surface of the housing 19b and the cover 19a. External air flows, sideways, in and out of the vent portion 19 through the slit S and enters and exits from the case front wall 11 through the water repellent filter 19d. Therefore, ventilation of external air to the inside and the outside of the case front wall 11 can be effected while collision and deposition of extraneous matter directly with and on the water repellent filter 19d are prevented.

In the present embodiment, the vent portion 19 is made separately from the case 10. However, the vent portion 19 can also be formed integrally with the case front wall 11 of the case 10. Alternatively, a simple structure embodied by attaching a water repellent filter to a hole opened in the case front wall 11 can also be adopted as the vent portion 19.

Figure 5:
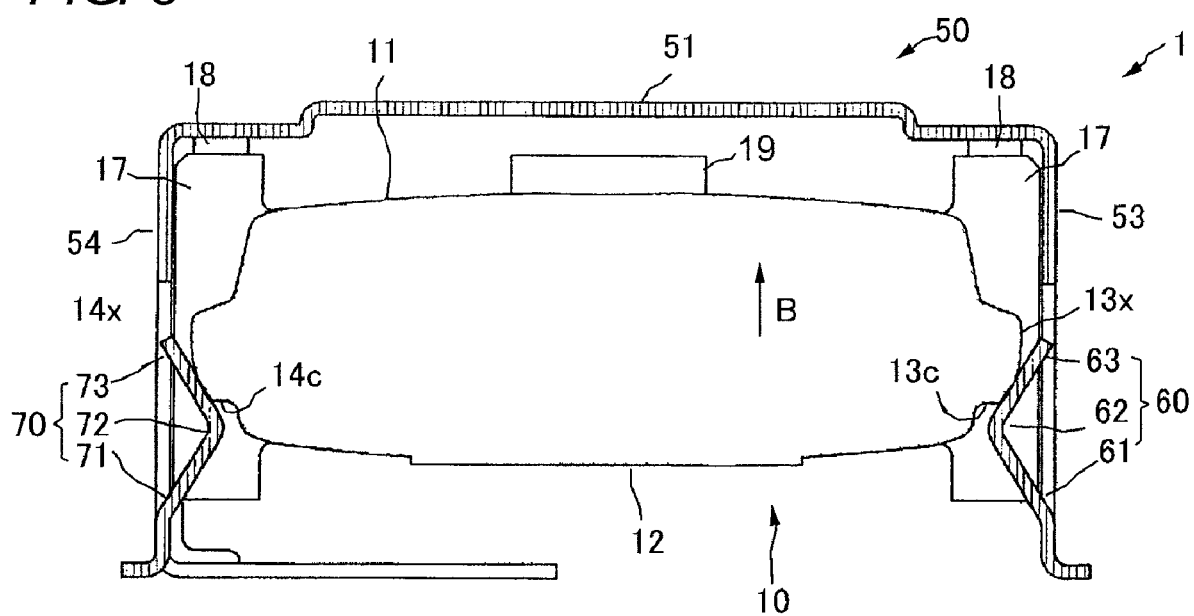
FIG. 5 is a cross-sectional view of the circuit board case of the first embodiment cut along a direction in which fittings are aligned.

FIG. 5 shows a cross section of the circuit board case 1 cut along a direction with which the fittings 60 and 70 are aligned (i.e., the direction perpendicular to the longitudinal direction L). The case 10 is deeply mounted until the rib portions 13x and 14x on the side walls of the case 10 climb over the respective projections 62 and 72 of the cover 50, and an area (a surface) between the projection 62 and the upper end (the free end) 63 of the fitting 60 engages a first wall surface of the case 10 (the second rise portion 13c of the rib portion 13x), thereby urging the case 10 toward the cover front wall 51 (in the direction of the arrow B in FIG. 5). Similarly, an area (a surface) between the projection 72 and the upper end (the free end) 73 of the fitting 70 engages another first wall surface (the second rise portion 14c of the rib portion 14x) of the case 10.

The ends of the shock-absorbing rubbers 18 contact the inner side of the cover front wall 51 of the cover 50, thereby holding the case 10 in the cover 50. Specifically, each of the shock-absorbing rubber members 18 are located in a space defined between the cover front wall 51 of the cover 50 and the case 10, thereby urging the case 10 along a direction from the cover front wall 51 to the fittings 60 and 70.

Moreover, the vent portion 19 is covered with the cover front wall 51 and thereby protected from flying gravel, and the like. Further, clogging of the vent portion 19, which would otherwise be caused by accumulation of dust, and the like, is prevented by the cover front wall 51. In the present embodiment, since a space is formed between the vent portion 19 and the cover front wall 51, ventilation of the vent portion 19 is further enhanced. Further, due to the space, physical impact to the cover front wall 51, which might be caused by flying gravel or the like, can hardly reach the vent portion 19. Thus, the occurrence of a fracture in the vent portion 19 can further be prevented.

As described above, in the first embodiment, the cover 50 holds the case 10 therein such that the case 10 is urged toward the cover front wall 51 by the fittings 60 and 70 provided on the cover 50. Therefore, even when physical impact, or the like, is inflicted on the cover from the direction of the cover front wall 51, the urging force counteracts the physical impact. Further, even when the side surface of the cover 50 is opened by physical impact, the case 10 is not easily dislodged from the cover 50. This is because the fittings 60 and 70 engage the first wall surface of the case 10 (the second rise portion 13c of the rib portion 13x and the second rise portion 14c of the rib portion 14x), so as to reliably hold the case 10.

Further, in the first embodiment, when the case 10 is housed in the cover 50 from the opening 59 opened at the position opposite the cover front wall 51, the fittings 60 and 70 can become elastically deformed, thereby elastically holding in the cover 50 the case 10 housed from the opening 59 of the cover 50.

Therefore, when the case 10 is housed from the opening 59 of the cover 50 by climbing over the fittings 60 and 70, the fittings 60 and 70 return to their original positions by elastic force, thereby elastically holding the case 10. The case 10 can be held and urged by means of only being mounted into the cover 50 from its opening 59. Consequently, it is not necessary to perform an operation such as folding of the fittings 60 and 70, so that working efficiency is enhanced. Moreover, even when the cover 50 is subjected to vibration or physical impact, the elastic force of the fittings 60 and 70 absorbs the vibration or the physical impact. This is because the case 10 is elastically held by the fittings 60 and 70, so that vibration, and the like, hardly reaches the case 10.

In the first embodiment, each of the fittings 60 and 70 extends to have a cantilever shape having a free end 61, 71 corresponding to a portion of the fitting 60, 70 closer to the cover front wall 51 and a fixed end 61, 71 corresponding to a portion of the fittings 60 and 70 opposite the cover front wall 51 and secured on the rise walls 53 and 54. Further, the fittings 60 and 70 include the projections 62 and 72 projecting toward the inside of the cover 50. The case 10 housed in the cover 50 from its opening 59 climbs over the projections 62 and 72, and is thus urged toward the cover front wall 51.

Therefore, even when physical impact, and the like, is inflicted on the cover front wall 51 (after the case 10 has been housed in the cover from its opening 59 so as to climb over the projections 62 and 72 of the fittings 60 and 70) the fittings 60 and 70 hardly open in the direction of physical impact (i.e., a direction from the cover front wall to a rear surface), so that separation of the case 10 from the cover 50 is further prevented. In contrast, if the fixed ends 61 and 71 of the fittings 60 and 70 are situated at positions close to the cover front wall 51, portions of the fittings 60 and 70 closer to their distal end sides than to the fixed ends 61 and 71 are more likely to open when physical impact is inflicted on the cover front wall 51.

In the first embodiment, the fittings 60 and 70 have L-shaped cross-sectional profiles having the projections 62 and 72 as apexes and recede toward the free ends 63 and 73 and the fixed ends 61 and 71. The first wall surfaces 13c and 14c of the case 10 engage a surface extending from the projection 62 to the free end 63 and a surface extending from the projection 72 to the free end 73, respectively. Therefore, the first wall surfaces 13c and 14c of the case 10 are supported by L-shaped areas (surfaces) of the fittings 60 and 70 extending from the projections 62 and 72 to the corresponding ends (free ends) 63 and 73, whereby the case 10 is reliably held.

In the first embodiment, the regulation members 17 and 17 are provided at the front and back portions of the case 10 in the longitudinal direction L perpendicular to the direction in which the fittings 60 and 70 extend. The outer surfaces of the regulation members 17 and 17 are situated outwardly of the case 10 as compared with the projections 62 and 72 of the fittings 60 and 70. Further, the interval d1 between the regulation members 17 and 17 is equal to or longer than the length d2 of each of the fittings 60 and 70 in the longitudinal direction L. Movement of the case 10 in the longitudinal direction L is regulated by placing the fittings 60 and 70 between the regulation members 17 and 17.

With this configuration, the fittings 60 and 70 are respectively arranged so as to enter between the regulation members 17 and 17, whereby movement of the case 10 in the longitudinal direction L is regulated.

In the first embodiment, a space is formed between the cover front wall 51 and the case 10, and the elastic members 18 are inserted into the space.

With this structure, vibration or physical impact inflicted on the cover 50 is absorbed by the elastic members 18, so that vibration, and the like, hardly reaches the case 10. Further, since the case 10 is sandwiched in the cover 50 by means of the urging force of the fittings 60 and 70 and elastic force of the elastic members 18, the case 10 can be held in the cover more stably.

Next, a second embodiment of the present invention is described.

Figure 6:
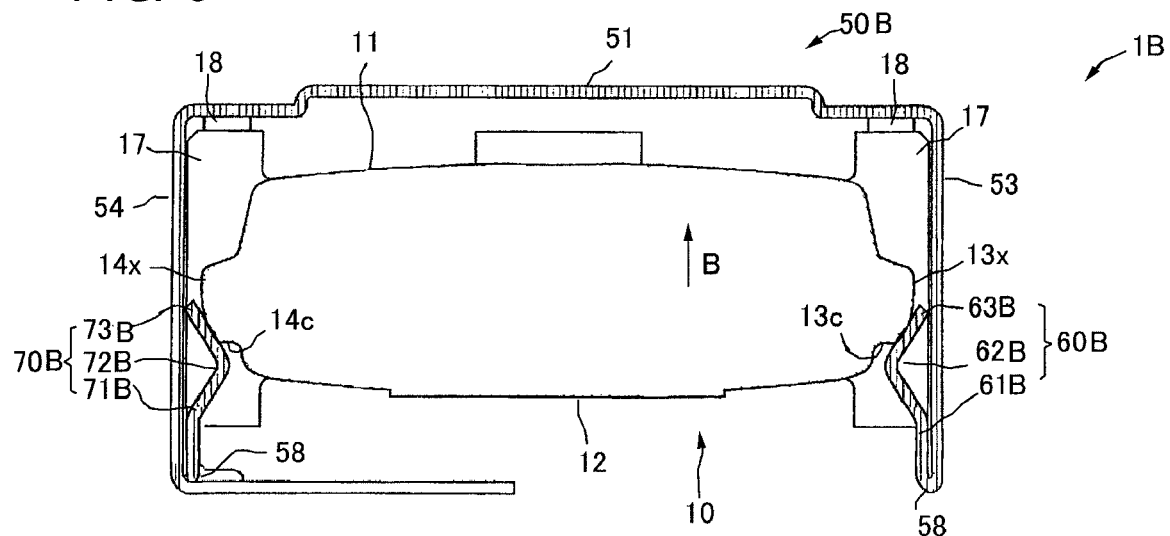
FIG. 6 is a cross-sectional view of a circuit board case of a second embodiment cut along a direction in which fittings are aligned.

FIG. 6 is a cross-sectional view showing a state of engagement between the case 10 and a cover 50B which form a circuit board case 1B according to the second embodiment of the present invention. The circuit board case 1B of the second embodiment is similar to the circuit board case 1 according to the first embodiment, except for the structure of fittings provided on the cover. Therefore, elements the same as those of the first embodiment are assigned the same reference numerals as shown in FIG. 1, and their repeated explanations are omitted.

In FIG. 6, the cover side wall 53 of the cover 50B downwardly extends (toward a rear surface side of the cover 50B), and the extended portion is bent by 180° at a bent edge 58, and a distal end 63B of the extended portion is situated in the vicinity of a center portion of the cover side wall 53. The distal end 63B of the extended portion is a free end, and an intermediate portion 61B upwardly returned from the bent edge 58 is a fixed end. As in the case of the fitting 60 of the first embodiment, a middle position between the intermediate area 61B and the distal end 63B is bent into the shape of the letter L, thereby defining a projection 62B that projects toward the inside of the cover 50B. That is, a cantilever-shaped extended portion extending from the intermediate potion 61B to the distal end 63B forms the fitting 60B. Similarly, an extended portion of the cover side wall 54 of the cover 50B is also bent at a lower position by 180° at the bent edge 58, and the extended portion forms a fitting 70B similar to the fitting 60B. In the present embodiment, the cover 50B is formed integrally from a metal plate, and the fittings 60B and 70B are elastically deformable.

When the case 10 is deeply inserted into the cover 50B until the rib portions 13x and 14x of the side walls of the case 10 climb over the respective projections 62B and 72B, an area (a surface) of the fitting 60B between the projection 62B and the distal end (free end) 63B engages the first wall surface of the case 10 (the second rise portion 13c of the rib portion 13x), thereby holding the case 10 while urging the case 10 toward the cover front wall 51 as in the first embodiment. Similarly, an area of the fitting 70B between the projection 72B and the distal end 73B engages the first wall surface of the case 10 (the second rise portion 14c of the rib portion 14x).

As described above, in the second embodiment, the fittings 60B and 70B are provided on the rear surfaces (the bent edges 58), which extend from the rise walls (the cover side walls 53 and 54) of the cover 50 opposite the cover front wall 51, by way of the fixed ends. In the present embodiment, even in such a case, the fittings may be deemed to be formed on the rise walls. The rear surfaces may extend to have a predetermined width in a direction parallel with the cover front wall 51 without being immediately bent toward the cover front wall 51 at the bent edges 58, and the fittings can also be provided on the respective extended portions.

Next, a third embodiment of the present invention will be described.

Figure 7:
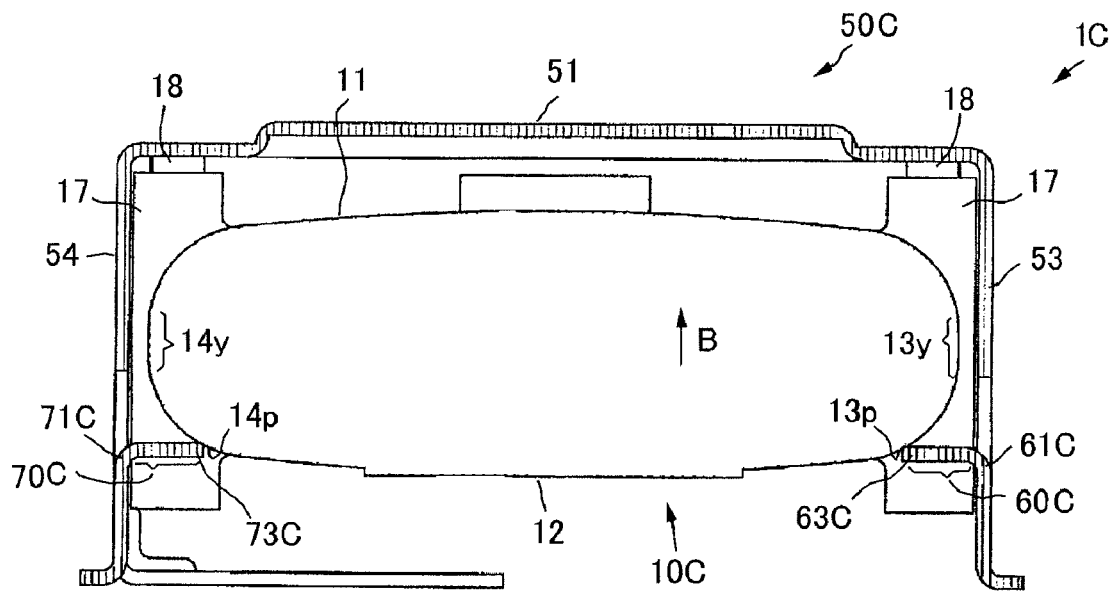
FIG. 7 is a cross-sectional view of a circuit board case of a third embodiment cut along a direction in which fittings are aligned.

FIG. 7 is a cross-sectional view showing a circuit board case IC of a third embodiment of the present invention in which a case 10C engages a cover 50C. The circuit board case IC of the third embodiment is similar to the circuit board case 1 of the first embodiment, except for the structure of fittings provided on the cover and the shape of side surfaces of the case. Elements the same as those described in connection with the first embodiment are assigned the same reference numerals as shown in FIG. 1, and their repeated explanations are omitted.

In FIG. 7, a C-shaped cut is formed in the vicinity of a center portion of the cover side wall 53 of a cover 50C, so as to form a cantilever-shaped fitting 60C in which an uncut lower end 61C (a rear surface side of the cover 50C) serves as a fixed end and in which a precut upper end 63C (a portion of the fitting 60C close to the cover front wall 51) serves as a free end. The fitting 60C is bent by 90° with respect to the cover side wall 53 at the lower end 61C (i.e., in parallel with the cover front wall 51), and an upper end 63C extends toward the inside of the cover 50.

Similar to the fitting 60C, a fitting 70C is provided on the cover side wall 54 of the cover 50C, and is bent by 90° with respect to the cover side wall 54 at the lower end 71C. A distance between the upper end 63C of the fitting 60C and the upper end 73C of the fitting 70C is smaller than the outer shape (the planar shape) of the case 10C. Further, this distance is determined such that when the case 10C is deeply loaded into the cover 50C, the case 10C is held between the upper ends 63C and 73C. In the present embodiment, the cover 50C is formed integrally from a metal plate, and the fittings 60C and 70C are elastically deformable.

Meanwhile, the case 10C is not provided with the rib portions 13x and 14x of the side walls, such as those provided on the case 10 of the first embodiment. Side walls 13y and 14y are substantially perpendicular to the case rear wall 12, and the respective side walls 13y and 14y are connected to the case rear wall 12 via curved surfaces. Therefore, in the case 10C, the first wall surface opposing the case front wall 11 refers to the case rear wall 12 and curved surfaces that connect the case rear wall 12 to the respective side walls 13y and 14y. The reason for this is that the respective side walls 13y and 14y are perpendicular to the case rear wall 12 and hence are not caught by fittings and do not work as surfaces to be held by the fittings 60C and 70C. Further, a second wall surface of the case 10C facing the same direction in which the case front wall 11 is oriented refers to the case front wall 11 and curved surfaces that connect the case front wall 11 to the respective side walls 13y and 14y.

When the case 10C is deeply inserted into the cover 50C until the side walls 13y and 14y climb over the respective fittings 60C and 70C, the upper end 63C which is a distal end of the fitting 60C engages the first wall of the case 10C (a position 13p on the curved surface), thereby holding the case 10C while urging the case 10V toward the cover front wall 51 of the cover 50C. Similarly, the upper end 73C which is a distal end of the fitting 70C engages the first wall surface of the case 10C (a position 14p on the curved surface).

In the third embodiment, the fittings 60C and 70C support the case 10C at the points 13p and 14p. Hence, when compared with the first and second embodiments in which portions of the fittings between their projections and their distal ends planarly support the second rise portions of the case rib portions, stability for holding the case may be slightly compromised.

Next, a fourth embodiment of the present invention will be described.

Figure 8:
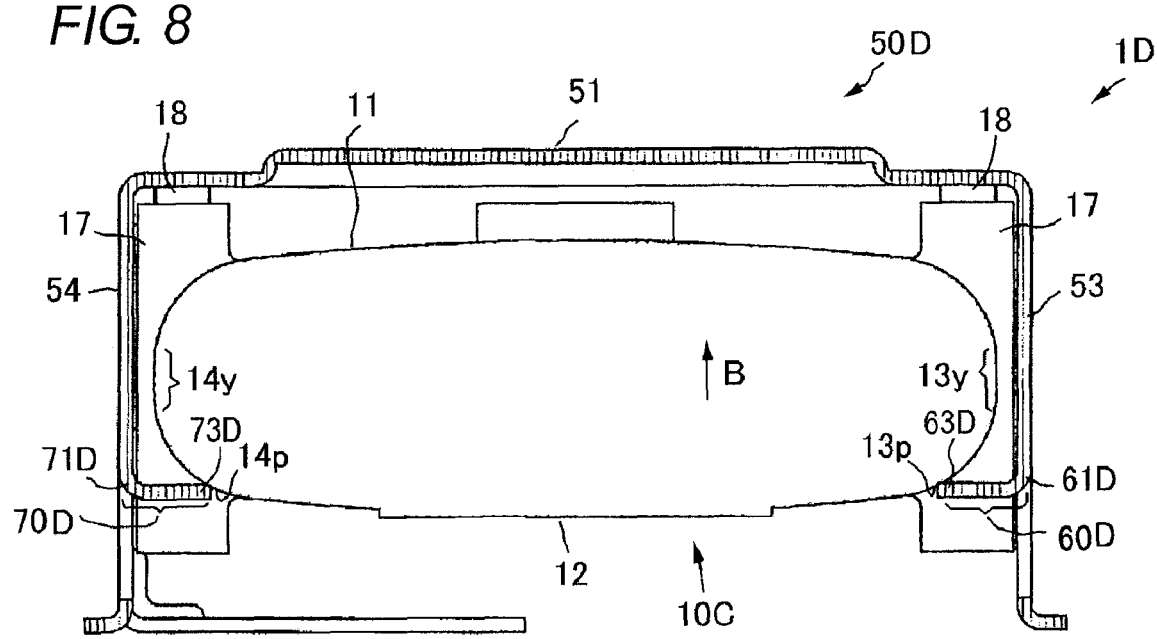
FIG. 8 is a cross-sectional view of a circuit board case of a fourth embodiment cut along a direction in which fittings are aligned.

FIG. 8 is a cross-sectional view showing a state of engagement of the case 10C and a cover 50D which form a circuit board case 1D of a fourth embodiment of the present invention. The circuit board case 1D of the fourth embodiment is the same as the circuit board case 1 of the third embodiment, except for the structure of fittings provided on the cover. Therefore, constituent elements that are the same as those described in connection with the third embodiment are assigned the same reference numerals as shown in FIG. 7, and their repeated explanations are omitted.

In FIG. 8, a C-shaped cut is formed in the vicinity of a center portion of the cover side wall 53 of the cover 50D, so as to form a piece-shaped fitting 60D in which an uncut upper end 61D (a cover front wall side of the cover 50D) serves as a fixed end and in which a precut lower end 63D (a rear surface side of the cover 50D) serves as a free end. Similar to the fitting 60D, a fitting 70D is provided on the cover side wall 54 of the cover 50D including uncut upper end 71D and precut lower end 73D. In the present embodiment, the cover 50D is formed integrally from a metal plate, and the fittings 60D and 70D are thick and not elastically deformable. Hence, before inserting of the case 10C, the fittings 60D and 70D extend along the respective cover side walls 53 and 54. As described below, after the case 10C is deeply inserted into the cover 50D, the fittings 60D and 70D are bent by 90° with respect to the respective cover side walls 53 and 54 at upper ends 61D and 71D (in parallel with the cover front wall 51), thereby holding the case 10C between the fittings 60D and 70D.

The case 10C is deeply inserted into the cover 50D such that the side walls 13y and 14y of the case 10C come closer to the cover front wall 51 with reference to the upper ends 61D and 71D of the respective fittings 60D and 70D, and the upper ends 61D and 71D of the fittings 60D and 70D are bent by 90°, whereby a lower end 63D that is a distal end of the fitting 60D engages the first wall surface of the case 19C (the position 13p on the curved surface), and the case 10C is held while being urged toward the cover front wall 51 of the cover 50D. Similarly, a lower end 73D that is a distal end of the fitting 70D engages the first wall surface of the case 10C (the position 14p on the curved surface).

Figure 9:
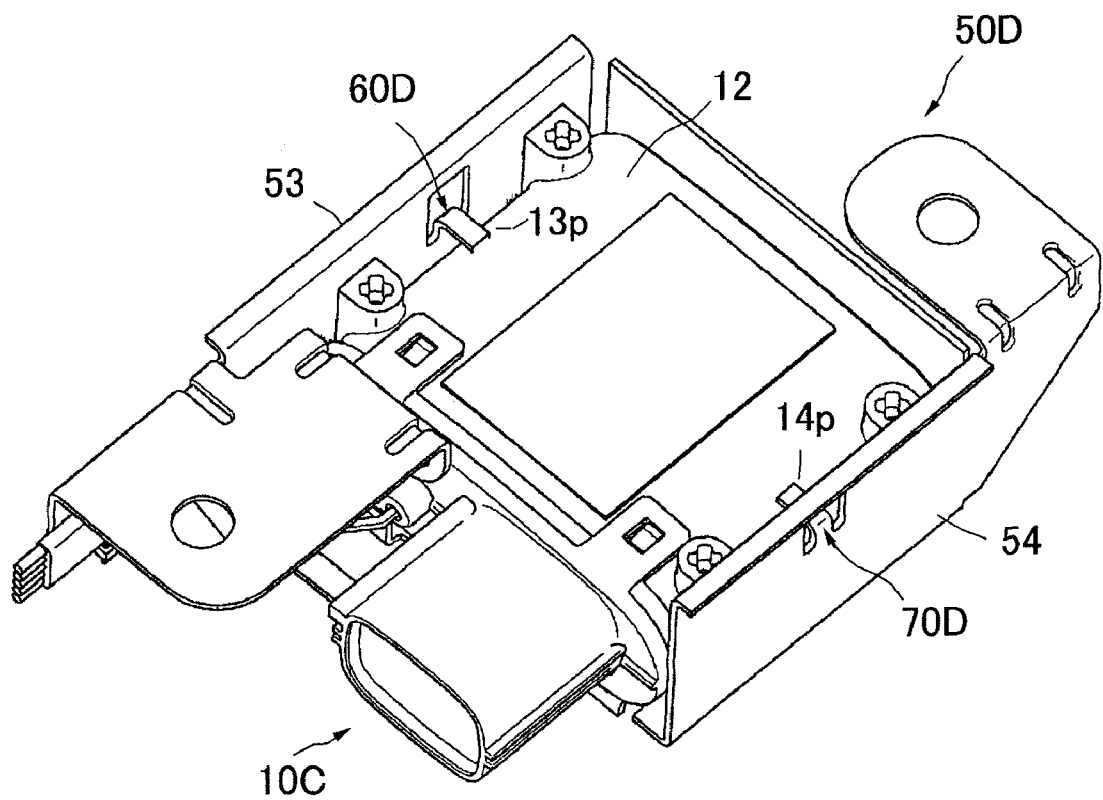
FIG. 9 is a perspective view showing the circuit board case of the fourth embodiment including the inserted into the cover.
Figure 10:
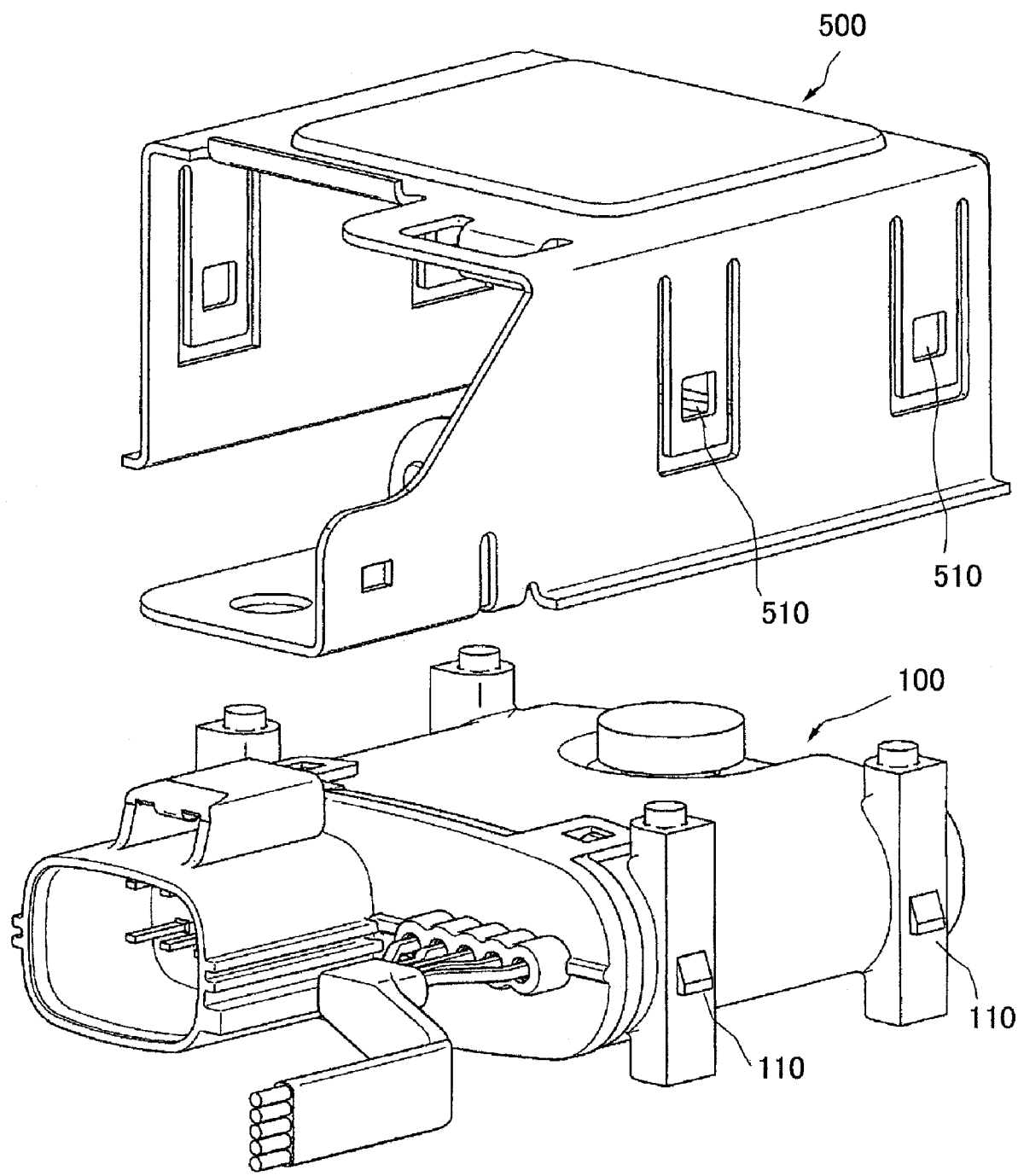
FIG. 10 is an exploded perspective view showing a case and a cover that make up a related-art circuit board case.

FIG. 9 shows a circuit board case 1D when viewed from the rear surface side of the cover 50D. The fittings 60D and 70D engage the positions 13p and 14p on the first wall surface of the case 10C, thereby holding the case 10C while urging the case 10C toward the cover front wall of the cover 50D.

In the fourth embodiment, the fixed ends of the fittings 60D and 70D are situated on the cover front wall 51 side of the cover 60D. Hence, when physical impact, and the like, is inflicted on the cover 50D from its cover front wall 51 side, portions of the fittings 60D and 70D located closer to the distal end side thereof with reference to the fixed ends are likely to open as compared with the third embodiment. Further, after the case 10C has been inserted into the cover 50D from the opening of the cover 50D, work, such as folding of the fittings, becomes necessary.

In the present embodiment, a material used for the case is not particularly limited. However, when the case is made of a resin, it becomes possible to readily manufacture, with superior efficiency, a complicated shape including the first wall surface, the regulation members, the connector, and the like, by means of integral molding. Further, when the cover is made of metal, the following advantages can be realized: the cover can exhibit a high capability of protecting the case from external physical impact; the fittings can be made so as to be elastically deformable; and the fittings for holding the case can easily be bent.

Needless to say, the present invention is not limited to the above embodiments and encompasses various modifications or equivalents that fall within the concept and scope of the present invention. For instance, the circuit board case can be applied to all applications as well as to control of an automobile engine. Further, the shape of the case and the shape of the cover are not limited, as well.

It should further be apparent to those skilled in the art that various changes in form and detail of the invention as shown and described above may be made. It is intended that such changes be included within the spirit and scope of the claims appended hereto.

This application is based on Japanese Patent Application No. 2008-193645 filed Jul. 28, 2008 and Japanese Patent Application No. 2009-084469 filed Mar. 31, 2009, the above applications incorporated herein by reference in their entirety.

What is claimed is:

1. A circuit board case comprising:
a cover that comprises a cover front wall and a rise wall connected to the cover front wall, the cover being attachable to an attaching object at a position on the rise wall opposite the cover front wall; and
a case that houses a circuit board and comprises a case front wall and a first wall surface oriented toward a direction opposite the case front wall, the case being housed in the cover such that the case front wall opposes the cover front wall,
wherein a fitting that engages the first wall surface is formed in the rise wall of the cover so as to urge the case toward the cover front wall, to thereby hold the case within the cover.

2. The circuit board case according to claim 1, wherein the fitting elastically urges the first wall surface of the case toward the cover front wall.

3. The circuit board case according to claim 1, wherein the fitting is elastically deformable when the case is housed in the cover from an opening opened in a position on the cover opposite the cover front wall, and the fitting elastically holds the case in the cover.

4. The circuit board case according to claim 3, wherein the fitting has a free end facing the cover front wall, and a fixed end opposite the cover front wall and fixed to the rise wall, wherein the fitting comprises a projection projecting toward an inside of the cover, and wherein the case is inserted in the cover from the opening by climbing over the projection so as to be urged toward the cover front wall.

5. The circuit board case according to claim 4, wherein the fitting has an L-shaped cross-sectional profile that has the projection as an apex and recedes toward the free end and the fixed end, and wherein the first wall surface of the case engages a surface of the fitting extending from the projection to the free end.

6. The circuit board case according to claim 1, wherein the fitting extends toward an inside of the cover from a fixed end thereof to a free end thereof, and wherein the first wall surface of the case engages the free end of the fitting and is urged toward the cover front wall.

7. The circuit board case according to claim 4, wherein the case comprises regulation members provided at front and back positions on the case along a longitudinal direction perpendicular to a direction in which the fitting extends, wherein outer surfaces of the respective regulation members are situated at an outer side of the case with respect to the projection of the fitting, wherein an interval between the regulation members is equal to or larger than a length of the fitting in the longitudinal direction, and wherein movement of the case in the longitudinal direction is regulated by placing the fitting between the regulation members.

8. The circuit board case according to claim 1, wherein a space is formed between the cover front wall and the case, and an elastic member is interposed in the space.

9. The circuit board case according to claim 1, wherein the case front wall comprises a vent portion covered with the cover front wall and comprising a filter having air permeability and water repellency so as to allow air in and out of the case.

* * * * *